(12) United States Patent
Vilgiate

(10) Patent No.: US 6,346,003 B1
(45) Date of Patent: *Feb. 12, 2002

(54) CIRCUIT CARD GUIDE HAVING A GROUNDING STRIP

(75) Inventor: Anthony W. Vilgiate, Lake Forest, CA (US)

(73) Assignee: Bivar, Irvine, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/253,845

(22) Filed: Feb. 22, 1999

(51) Int. Cl.[7] .................................................. H01R 13/64
(52) U.S. Cl. ...................... 439/377; 361/799; 439/76.1; 439/62; 439/94
(58) Field of Search ................................ 439/377, 76.1, 439/64, 62, 61, 59, 92, 93, 94; 361/799

(56) References Cited

U.S. PATENT DOCUMENTS

| | | | | |
|---|---|---|---|---|
| 3,184,069 A | * | 5/1965 | Rosenberg | 439/64 |
| 5,055,061 A | * | 10/1991 | Lichtenwalter | 439/377 |
| 5,187,648 A | * | 2/1993 | Ito | 361/424 |
| 5,467,254 A | * | 11/1995 | Brusati et al. | 361/799 |
| 5,708,552 A | * | 1/1998 | Han et al. | 361/799 |

* cited by examiner

Primary Examiner—P. Austin Bradley
Assistant Examiner—Truc Nguyen
(74) Attorney, Agent, or Firm—Harold L. Jackson

(57) ABSTRACT

An edge guide arrangement for circuit boards is disclosed including a guide rail having a circuit board edge-receiving channel with a grounding strip therein. The grounding strip has clips at each end for resiliently grasping the guide rail thereby holding the grounding strip in its position within the channel. The grounding strip with its end clips can be standardized and inventoried in large quantities to be assembled to a variety of guide rails.

11 Claims, 4 Drawing Sheets

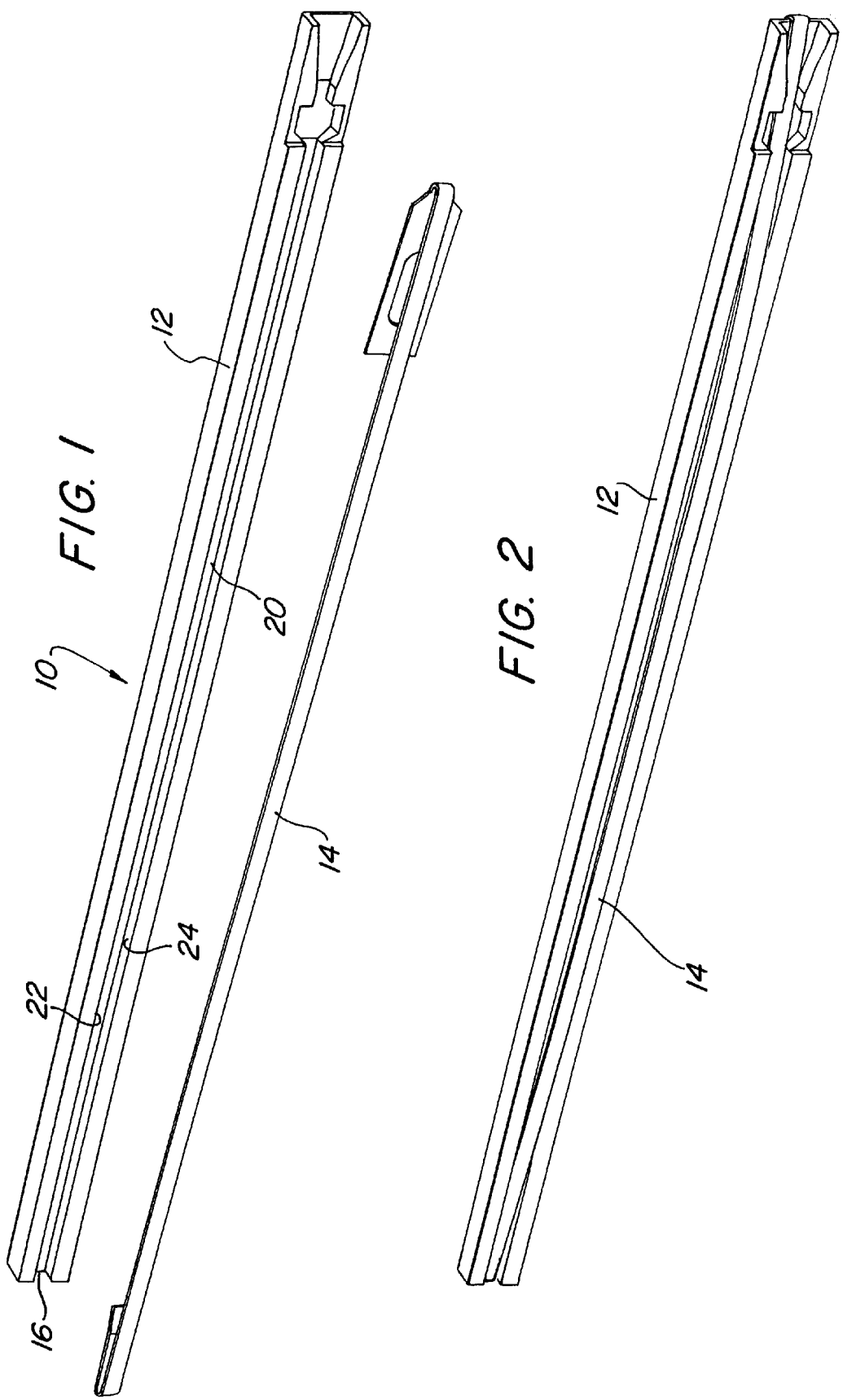

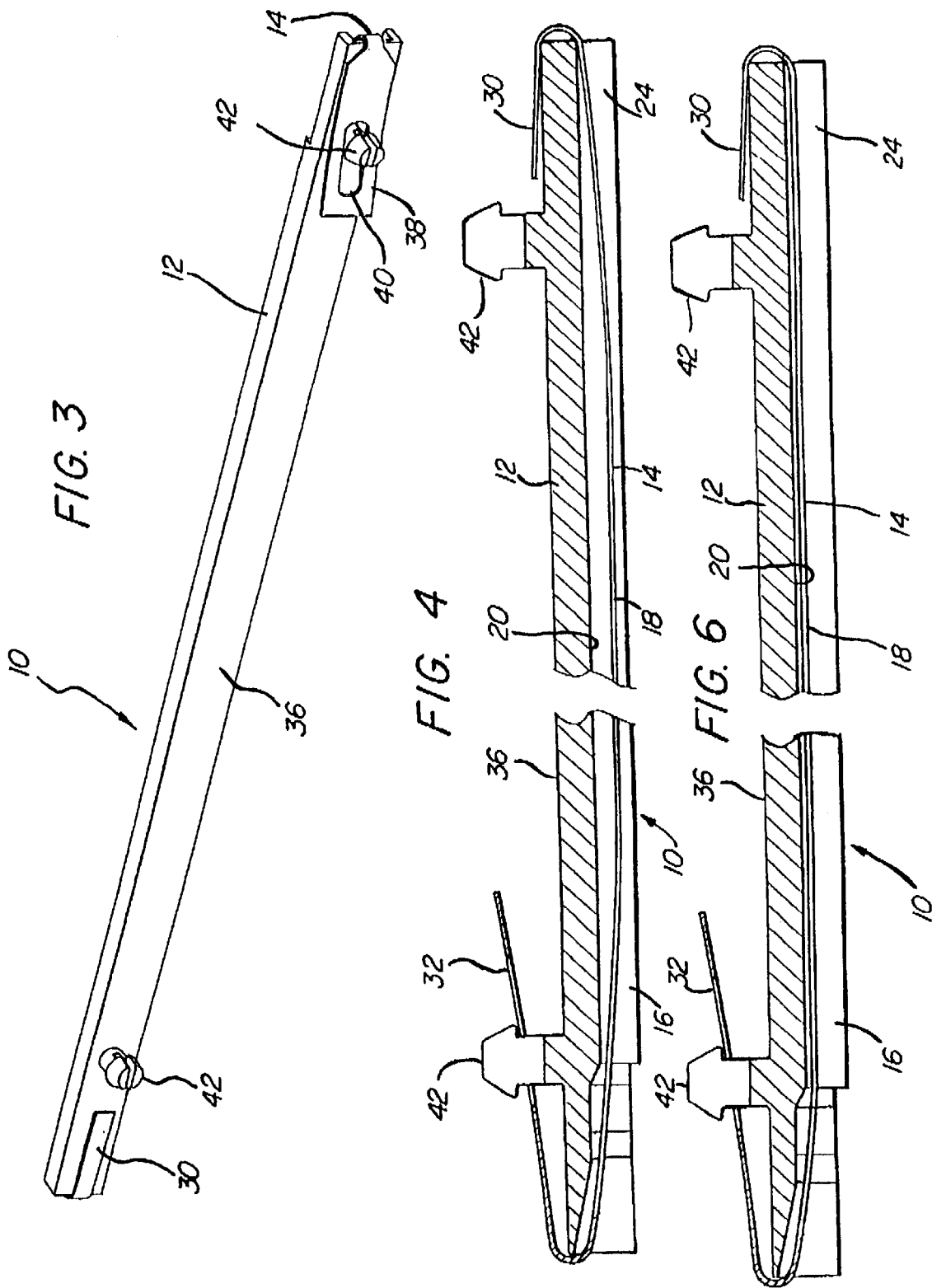

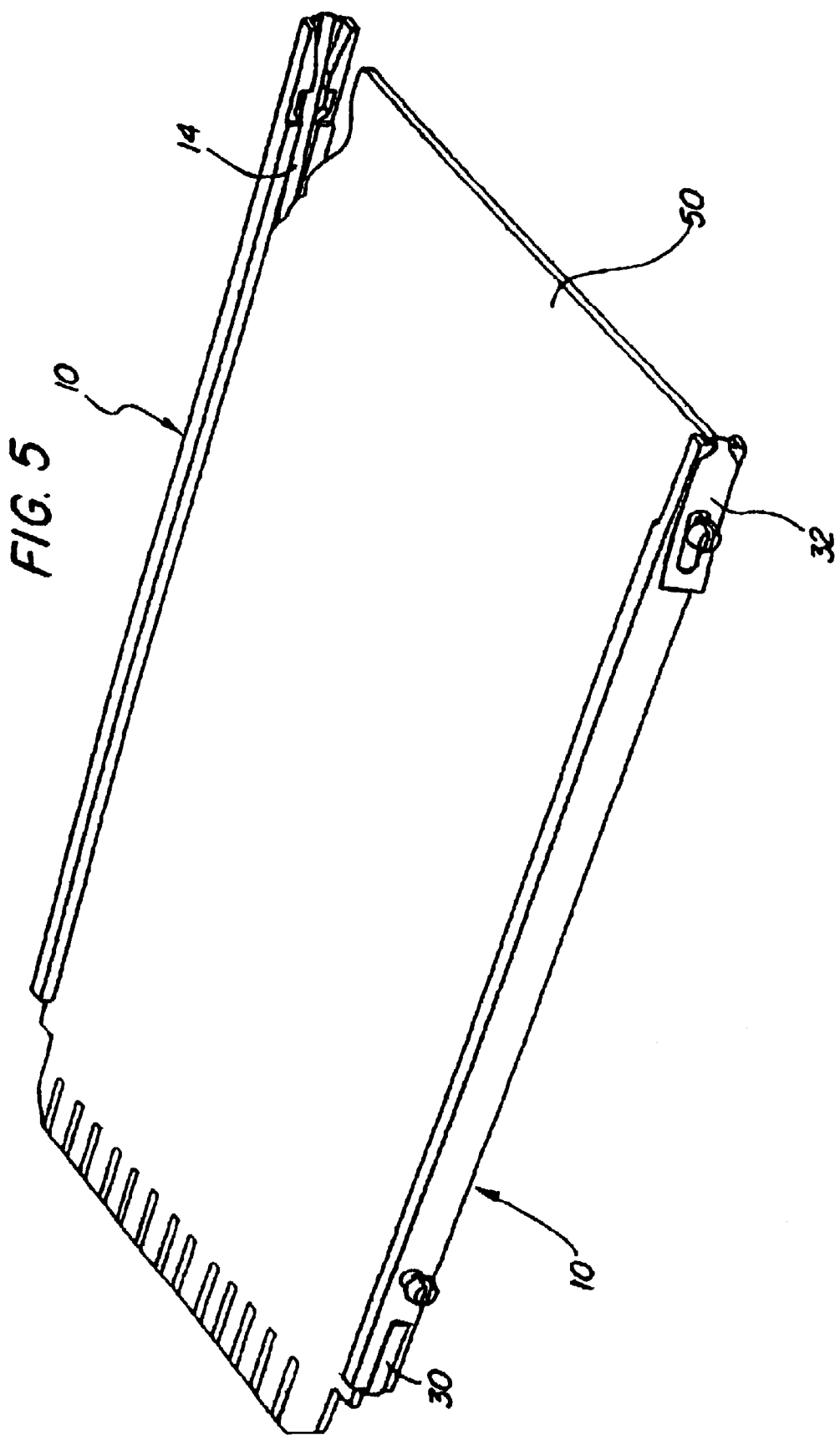

CIRCUIT CARD GUIDE HAVING A GROUNDING STRIP

BACKGROUND OF THE INVENTION

1. Field of the Invention

This invention relates generally to printed circuit boards, and more particularly, it is directed to an edge guide and retainer for printed circuit boards.

2. Description of the Prior Art

Printed circuit boards provide the foundation on which electronic components such as resistors, capacitors, transistors, inductors, semiconductor chips and other discrete electronics are mounted. These circuit boards have the metal traces that provide electrical pathways to connect the electronic components to satisfy an electrical function or system requirement. While each circuit board can accommodate a large number of electronic components, in some applications several circuit boards may be needed to provide the necessary circuitry for the particular electronic product. In such cases, multiple circuit boards may either be mounted in a stacked arrangement, one board on top of the other or in a side by side arrangement. In any case, the board is typically mounted in an electronic chassis, being plugged into a card receiving connector at one end and guided by card guides along two side edges.

Such card guides conventionally take the form of a rail with a squared channel therein. The card guides are typically made of nonconductive materials such as plastic. While these conventional card guides are suitable for various applications, growing concerns about electromagnetic interference, radio frequency interference and electromagnetic contamination within electronic environments are necessitating reliable circuit board grounding solutions. Additionally, build up of electrical charges in the circuit card can result in damage to or ultimate failure of internal integrated semiconductor circuits or other circuit elements on the card as well as the electronic apparatus itself. Grounding may be particular important in application involving computer peripherals, accessories and removable media including hard drives, modems and external storage units. In order to mitigate the above problems, various grounding schemes have evolved. Circuit cards have been provided with conductive grounding contacts along the peripheral edge of the card in fixed locations. Cooperative grounding contacts such as clips or terminals are provided on the card-receiving connector or card guides. When the circuit card is slid into the card guide the circuit card grounding contacts line up and mate with the clips on the card guide providing a grounding pathway therebetween While such conventional grounding schemes have been used in industry for many years, it would be advantageous to provide a grounding arrangement for the card receiving connector or card guides that could accommodate grounding contacts on various locations along the edge of a circuit card. Such a universal grounding clip arrangement that is also simple to manufacturer in large quantities and that provides a reliable grounding solution would provide an advancement in the art.

SUMMARY OF THE INVENTION

The foregoing mentioned disadvantages are avoided by a circuit board edge guide which has a grounding strip along its entire length. The edge guide has a squared channel adapted to guide a circuit card to its desired mounting position which typically is a connection with a card-receiving edge connector. A conductive grounding strip is mounted on the edge guide in the squared channel for engaging the edge of the circuit board and making electrical contact with any grounding contacts on the board'edge. Accordingly, advantageously with the above described grounding arrangement provided along the extent of the edge guide, this circuit board edge guide can work with a variety of circuit cards with grounding contacts in various locations along the edge thereof.

The invention contemplates that the grounding strip be constructed as a universal structure for mounting on a variety of circuit board edge guides by simply clipping on. In the preferred embodiment, the grounding strip is formed from stainless steel having an elongated section, each end thereof having short integrally formed clips. As such, the grounding strip can simply be placed in the guide channel with the clips at ends clipped over the ends of the edge guide. Surprisingly, this simple grounding arrangement reliably affixes securely to the edge guide. Furthermore, the relative simplicity of this arrangement allows the edge guide and grounding strip to be made in large quantities and easily assembled.

The construction and operation of a preferred embodiment of the circuit board edge guide of the present invention may best be understood by reference to the following description taken in conjunction with the accompanying drawings.

BRIEF DESCRIPTION OF DRAWINGS

FIG. 1 is an exploded perspective view of a circuit card edge guide in accordance with the principles of the invention illustrating the two parts, the edge guide beam and grounding contact conductive strip, prior to assembly;

FIG. 2 is a perspective view of the circuit card edge guide of FIG. 1 illustrating the conductive strip assembled onto the guide beam;

FIG. 3 is a perspective rear view of the circuit card guide shown in FIG. 2;

FIG. 4 is a cross-sectional top view of the circuit card edge guide showing the conductive strip arched to provide spring biasing action;

FIG. 5 is a perspective view illustrating a circuit board inserted between two circuit card edge guides;

FIG. 6 is a cross-sectional top view of the circuit card edge guide showing the conductive strip mounted flush to the edge guide beam.

DESCRIPTION OF THE PREFERRED EMBODIMENT

Figure 7:
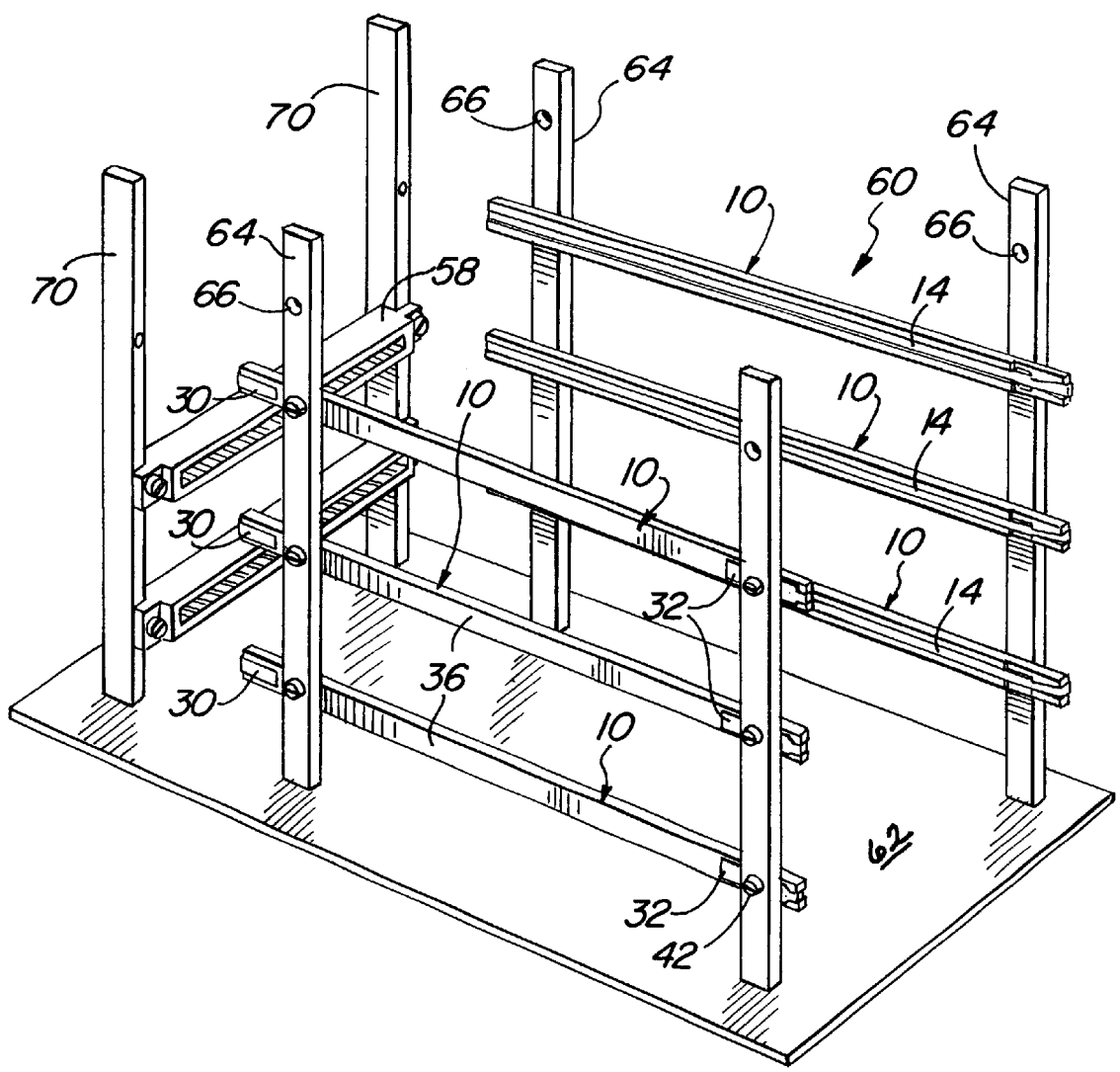
FIG. 7 is a perspective view illustrating a circuit card mounting framework.

Referring now to the drawings and more particularity to FIG. 1, there is shown a printed circuit board edge guide 10 for providing grounding connection to the edge of a circuit board including an elongated beam 12 and a conductive grounding strip 14. The elongated beam 10 has a channel 16 sized and shaped for slideably receiving the edge portion of a printed circuit board. More specifically, the elongated beam channel may take the form of a rectangularly shaped groove with a bottom wall 20 and two upright lateral walls 22 and 24. The guide beam is preferably made of a plastic type material such as natural nylon or glass-filled nylon material, for example. A flared section of the groove at one end of the beam facilitates insertion of a printed circuit board into the edge guide.

The conductive grounding strip 14 is an elongated strip of metal which may be stainless steel, for example, which material resists corrosion, oxidation, has long shelf life and also resists reacting with most chemical and solvents used in electronic assembly processes. The width of the conductive grounding strip 14 is selected to fit in the channel 16 of the edge guide and overlie the bottom wall 20 thereof to form the grounding section 18 of the grounding strip. Conductive strip 14 has two integral end clips at each end of the grounding section 18, which in this description of a preferred embodiment comprise short resilient hook or ear sections 30 and 32. The conductive strip 14 can be easily mounted onto the elongated beam 12 by pulling on the resilient clips portions 30 and 32 to work the grounding section 18 of the conductive strip 18 into the channel 16 and clips 30, 32 behind the back wall 36 of the beam 12, to provide the assembled combination shown in FIG. 2.

The resilient clip portions are shown with more particularity in FIG. 3, wherein one clip portion 30, is simply a bent over extension of the grounding section 18, which resiliently seats directly on the back wall 36 of the beam 12. The other clip 32 has a flared out end portion 38 with slot 40 therein. This clip by means of slot 40 is inserted over plug 42 of the beam to resiliently engage the beam. The beam in this particular embodiment has two plugs 42 shown on its back wall 36 which plugs insert into cooperative holes in the framework of the electronic unit such as a PC card housing (not shown).

The grounding section 18 of the conductive grounding strip 14 may be seated flush to the bottom wall 20 of the channel 16, as shown in FIG. 6. Alternatively, the grounding section may also be seated in the channel arching away from the bottom wall 20 of the channel, as shown with more particularity in FIG. 4. In this alternative embodiment, the grounding strip provides a spring action against the side edge of a circuit board slid into engagement with the conductive grounding strip. When the edge guide 10 is mounted in an electronic chassis the two plugs 42 are inserted into cooperative holes in the framework, and one or both of the clips may be pressed between the back of the edge guide and metal frame work providing a grounding path from a circuit board through the grounding strip to the chassis framework.

Typically, two edge guides 10 are attached to a framework structure 60 in opposed relationship to guide a printed circuit card 50 into its desired position in an electronic assembly, as shown in FIGS. 5 and 7. The printed circuit card (PC card) 50 is inserted into the open flared ends of the recessed guide paths or channels 16, slid along the opposed card guides 10 and plugged into an end connector 58, such as a mother board connector, input output I/O connector, daughter card connector, for example. As such, the card guides 10 provide alignment of the PC card to such end connectors.

The framework structure 60 may include a metal base member 62 which has a plurality of vertically disposed metallic posts 64 each post having holes for receiving the plugs 42 on the back wall of the edge guide. The clip portion 32 of the conductive strip 14 is sandwiched between the vertical post and the back of the edge guide, in conductive engagement with the vertical post. A conductive path is thereby provided form the edge of the PC card 50 through the conductive strip to the metallic post and the metal base. Other vertical posts 70 support and position each of the end connectors 58 in alignment with a pair of edge connector. Any number above described edge guide arrangements could be mounted in a housing with the above-described framework providing for a number of PC cards needed to form the electronic apparatus desired such as a personal computer, medical apparatus or avionics equipment.

There has thus been described an improved edge guide which can be reliably preassembled and used during handling and assembly of single or multiple circuit board structures. Large quantities of edge guide or grounding spring can be readily manufactured at relatively low costs. Thus, large customer demands for product can be met quickly and reliably. Advantageously, one grounding contact arrangement can be used with a variety of edge guides. Accordingly, various modifications of the edge guide will occur to persons skilled in the art without involving any departure from the spirit and scope of the invention as set forth in the appended claims.

What is claimed is:

1. An edge guide for circuits boards which have two opposed sides terminating in opposed edges, comprising:
    an elongated nonconductive member having an elongated channel of a given length with a bottom wall and two upright lateral walls and two ends for receiving one of the edges of a circuit board inserted therein, and
    an elongated conductor element disposed in the elongated channel and affixed to the elongated member, the conductor element extending substantially along the entire length of the channel and above the bottom wall for contacting only said one edge and not the sides of said circuit card inserted into the channel;
    the conductor element having two ends with each end being wrapped around a respective end of the nonconductive member to secure the conductor element to the nonconductive member.

2. The edge guide defined in claim 1 wherein the conductor element is a flat elongated conductive metallic strip.

3. The edge guide defined in claim 2 wherein the channel is rectangularly shaped.

4. The edge guide defined in claim 3 wherein the elongated conductive strip is attached to the elongated member such that the strip provides resilient spring action.

5. The edge guide defined in claim 3 wherein the channel is flared at one end thereof, for aiding the insertion of a circuit board into the channel.

6. The edge guide defined in claim 2 wherein the elongated conductive strip is affixed to the elongated member by integral resilient clips at each end of the strip.

7. The edge guide defined in claim 6 wherein the conductive strip is made of stainless steel.

8. A circuit board edge rail, comprising:
    a nonconductive elongated beam having two ends and a back wall defining a channel opposite the back wall and extending substantially the length of the beam, the channel being shaped and sized for receiving an edge portion of a printed circuit board and having a bottom wall;
    an elongated thin strip of metallic material disposed within the channel in the beam adjacent the bottom wall thereof, the strip having two ends, each of the ends being wrapped around a respective end of the beam and terminating in a spring clip positioned against a back wall of the beam adjacent the respective end for resiliently engaging and affixing the metallic strip onto the beam.

9. The circuit board edge rail defined in claim 8 wherein the spring clips of the metallic strip each comprise short integral bent over sections of the elongated thin strip of metallic material.

10. The circuit board edge rail defined in claim 9 wherein the elongated beam further includes a plug extending from the back wall thereof adjacent one end and wherein one of the spring clips of the metallic strip has a slot for receiving a plug on the circuit board edge rail.

11. The circuit board edge rail defined in claim 10 wherein the metallic strip is made from stainless steel material.

* * * * *